MULTIVIBRATOR CIRCUITS HAVING A WIDE RANGE OF CONTROL

Filed July 18, 1963

2 Sheets-Sheet 1

INVENTOR.
FRANK W. WEBER
BY
Christie, Parker & Hale
ATTORNEYS.

Oct. 11, 1966 F. W. WEBER 3,278,756

MULTIVIBRATOR CIRCUITS HAVING A WIDE RANGE OF CONTROL

Filed July 18, 1963 2 Sheets-Sheet 2

INVENTOR.
FRANK W. WEBER
BY
Christie, Parker & Hale
ATTORNEYS.

United States Patent Office 3,278,756

Patented Oct. 11, 1966

3,278,756
MULTIVIBRATOR CIRCUITS HAVING A WIDE RANGE OF CONTROL

Frank W. Weber, Duarte, Calif., assignor to Burroughs Corporation, Detroit, Mich., a corporation of Michigan Filed July 18, 1963, Ser. No. 295,902
7 Claims. (Cl. 307—88.5)

This invention relates to multivibrator circuits and, more particularly, to multivibrator circuits having an extremely wide range of control.

Multivibrator circuits generally employ vacuum tubes or transistors connected as amplifying stages or as switching stages with coupling circuits therebetween to cause alternate operation of the stages. In a monostable multivibrator, for example, one of the amplifiers is normally conducting or one of the switches is normally closed while the other amplifier is off or the other switch is open. Also, one of the coupling circuits is generally an alternating-current feedback path from one amplifier or switch to the other, while the other coupling circuit is a direct-current coupling circuit. The monostable multivibrator has two states of operation, which are its normal state or stable state and its timing state or quasi-stable state. When a monostable multivibrator is operating in its normal state, there is required an external trigger pulse to cause the multivibrator to change states. Thereafter, the output of the multivibrator is generally taken from the normally conducting amplifier or normally closed switch so that the output pulse has a duration determined by the period of the quasi-stable or timing state.

An astable multivibrator operates in a similar manner. However, in an astable multivibrator, both coupling circuits are alternating-current feedback paths rather than one being a direct-current path.

In multivibrator circuits, it is possible to vary the width of the output pulse or the delay time of the multivibrator by varying one of the parameters in the alternating-current coupling circuit. However, the variations of a single parameter encounters practical limitations so that the range of variation is generally limited. For example, some of the alternating-current coupling circuits primarily comprise a timing capacitor with resistors connected in the charging path between the capacitor and a source of potential. Thereafter, to vary the pulse width or delay time, it is possible to vary the value of the capacitance or to vary the charging current available by varying the resistance of the resistors or by changing the voltage increment through which the capacitor has to charge. However, variable capacitors are not readily available in the large capacitances which are required for long delay times nor are large variations of the charging current or the voltage increments permissible because of the effect upon the operation of the amplifiers or electronic switches of the multivibrator.

Multivibrators are often employed as delay circuits in many different applications. One example is the computer art where it is desirable that the range of variation in the delay time be very broad. A particular application of a monostable multivibrator as a delay circuit is in the storage portion of a computer. Many computers employ a magnetic core memory in which the information is stored. For a proper operation of the storage and subsequent recovery of information from a magnetic core memory, the control circuitry must provide control signals corresponding to read pulses, write pulses and clock pulses, which must be synchronized. In the magnetic cores which are employed as memory devices, there is a requirement that the read pulses and write pulses be of sufficient duration to completely switch the core from one state to another. Not all cores have identical characteristics so that some require more or less current than do others. Additionally, when a core is switched from one state to another, there is excessive noise present at the beginning of the pulse. Therefore, when the information is being read out of a magnetic core memory, it is desirable to read this information at some time subsequent to the beginning of the read pulse to avoid the introduction of the noise in the output signal. Therefore, a strobe pulse is generally employed which occurs sometime after the initiation of the read pulse.

A typical strobe circuit presently employed in the computer art utilizes magnetic circuitry to produce the strobe pulse. The magnetic circuitry is generally made responsive to a clock pulse. It has been found that this circuitry is not sufficiently stable and does not have a sufficiently wide range of variation to permit the circuit to be employed with any one of a plurality of memory systems. Thus, it is desirable to have a circuit which will provide the strobe pulse at any selected time within an extremely wide range.

Therefore, in accordance with the invention, a multivibrator circuit having an extremely wide range of variation possible in the pulse width of the output signal or the delay time of the multivibrator comprises a first electrically sensitive stage and a second electrically sensitive stage. The multivibrator further comprises a coupling means connected between the two stages for making the first stage responsive to the operation of the second stage. The coupling means includes a timing capacitor and means for simultaneously varying the current passing through the capacitor and the voltage increment through which the capacitor must charge.

This novel multivibrator circuit may be advantageously employed as the primary control circuit in a circuit, which is effectively a multivibrator circuit. The effective multivibrator circuit comprises a first amplifier stage or electronic switch stage having an output terminal, a second amplifier stage or electronic switch stage having a control terminal and a third amplifier stage or electronic switch stage connected intermediate between the first stage and the second stage. The effective multivibrator circuit additionally comprises a means for coupling voltage variations from the output of the first stage to the input of the third stage. The coupling means comprises a timing capacitor and means for simultaneously varying the charging current passing through the capacitor and the voltage increment over which the capacitor is charged.

A modification to the effective multivibrator circuit is advantageously included when the delay time of the multivibrator is a minimum. The modification is the addition of a fourth amplifier stage or electronic switch stage between the output of the first stage and the control terminal of the third stage. The fourth stage controls the operation of the third stage in response to the removal of an input signal to the effective multivibrator circuit to permit the coupling circuit between the second and third stage to reset in preparation for the application of a subsequent input signal to the effective multivibrator circuit.

The above and other features and advantages of the present invention will be understood more clearly and fully upon consideration of the following specification and drawing in which.

Figure 1:
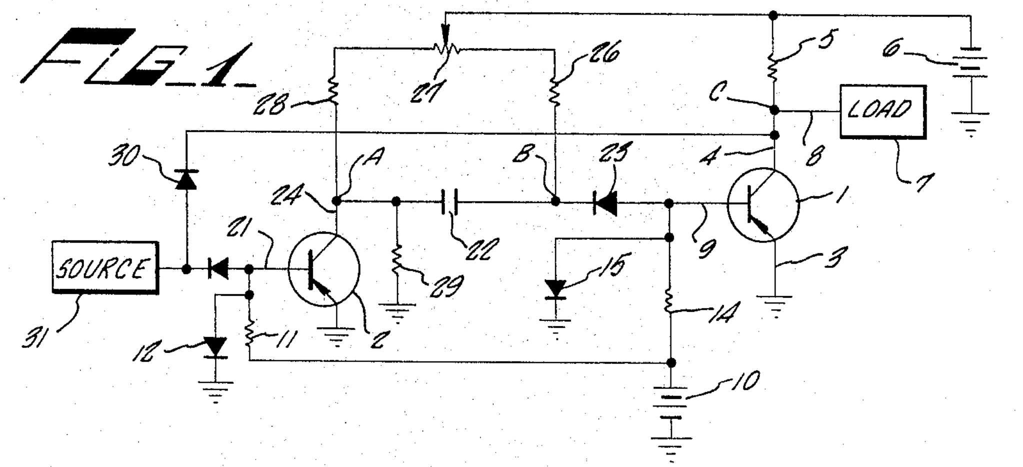
FIG. 1 is a schematic diagram of a multivibrator circuit in accordance with the invention.

The monostable multivibrator circuit of FIG. 1 comprises a transistor 1 which acts as an electronic switch and a transistor 2 which acts as another electronic switch. Even though this invention is described in conjunction with transistorized monostable multivibrator circuits, it is not in any way limited to these circuits alone. For example, the multivibrators could be astable and the electronic switches could employ vacuum tubes. Further, the two stages of the multivibrator could comprise relays and their associated contacts. In any case, the multivibrator basically comprises two electrically sensitive stages and at least one alternating-current coupling circuit.

Transistor 1 is normally in its on condition as a closed switch while transistor 2 is normally in its off condition as an open switch. Transistor 1 has an emitter 3 which is connected directly to ground reference and a collector 4, which is connected through a resistor 5 to the negative terminal of a source 6. The output of the multivibrator is taken from collector 4 of transistor 1 at point C and is coupled to a load 7 through lead 8.

An additional source 10 is employed in the multivibrator circuit of FIG. 1. This source provides a biasing current to insure the complete cutoff of transistor switches 1 and 2 when they are in their nonconducting state. The bias circuit comprises the source 10 connected in parallel to two voltage divider circuits. One voltage divider circuit includes a resistor 11 and a diode 12. The junction of resistor 11 and diode 12 is connected to base 21 of transistor 2 to couple this bias circuit to the transistor. The second voltage divider circuit comprises a resistor 14 and diode 15. The junction between the resistor 14 and diode 15 is connected to base 9 of transistor 1 to effect biasing of this transistor. However, for purposes of understanding the operation of the multivibrator circuits, in accordance with the invention, this bias circuit can be neglected.

In an astable or monostable multivibrator, there is required at least one alternating-current coupling circuit between the amplifier stages or the electronic switches. The alternating-current coupling circuit of FIG. 1 comprises a timing capacitor 22 which is connected in series with a diode 23 between collector 24 of transistor 2 and base 9 of transistor 1. The coupling circuit further comprises a resistor 26 connected between a point B at the junction of capacitor 22 and diode 23 and the negative terminal of source 6 through a variable resistor 27. The collector 24 of transistor 2 is connected to the negative terminal of source 6 through a resistor 28 and the variable resistor 27. The alternating-current coupling circuit further comprises a resistor 29 connected between collector 24 and the ground reference.

The multivibrator circuit of FIG. 1 is connected as a monostable multivibrator with the other coupling circuit between the two stages being a direct-current coupling circuit and comprising a diode 30 connected between the base 21 of transistor 2 and the collector 4 of transistor 1. The monostable multivibrator has 2 states of operation, which are its normal state or stable state and its timing state or quasi-stable state. When the multivibrator is operating in its normal state, that is with the transistor switch 1 closed and transistor switch 2 open, there is required an external pulse, which is supplied by a source 31, to cause the multivibrator to change states. The application of a negative pulse to base 21 of transistor 2 will cause this transistor to turn on so that the ground reference will, for all practical purposes, appear at the collector 24 and at point A. Point A will normally have a negative potential supplied through the voltage divider action of resistors 29 and 28 and variable resistor 27.

Upon the closing of transistor switch 2, the potential at point A will suddenly become almost zero, being less than zero by the negligible voltage drop across the emitter-collector junction of transistor 2. Thus, the nearly instantaneous change of the potential at point A will cause a nearly instantaneous change in the potential at point B through the capacitor 22. The potential at point B was slightly negative through the voltage divider action of the emitter-base path of transistor 1, diode 23, resistor 26 and variable resistor 27. This slightly negative potential at point B will change to some positive value, with the total change in potential being substantially equal to the change in potential at point A. The positive potential which now appears at point B will cause transistor switch 1 to be cut off to effect an opening of the switch.

Prior to the opening of transistor switch 1, the ground reference effectively appeared at collector 4 and at point C. Thus, when transistor switch 1 opens, the ground reference will be removed from point C and an increasing negative potential will occur. This negative potential will be coupled to the load 7 through lead 8. This negative potential at point C will exist as long as transistor switch 1 is open. The period of time that transistor switch 1 remains open is equal to the delay time or set time of the multivibrator. This time is dependent upon the time required for the voltage appearing at point B to change from its positive potential to its negative potential. This change in voltage is directly dependent upon the discharging of capacitor 22 through resistor 26 and variable resistor 27 and the source 6 to the ground reference. Thus, assuming the voltage drop across the emitter-collector junction of transistor 2 to be negligible, it is seen that the set time or delay time may be mathematically stated as:

$$\text{Set Time}=C22\times(R26+R27)\times\ln\left[\frac{V+\Delta V}{V}\right]$$

where C22 is the capacitance of capacitor 22, R26 is the resistance of resistor 26,

R27 is the resistance of resistor 27 in the current path, V is the quiescent voltage drop across (R26+R27), and ΔV is the voltage increment through which the capacitor voltage must change.

At the termination of the input pulse or the completion of the set time or delay time of the multivibrator, whichever occurs last, the multivibrator goes through a period of time called the reset time in which it returns to its normal operating conditions. Thus, upon the occurrence of both, the turning on of transistor switch 1 and the removal of the input signal from source 31, transistor switch 2 will open. Upon the opening of transistor switch 2, a negative potential will again appear at point A through the voltage divider action of resistors 29 and 28 and variable resistor 27. Thereafter, capacitor 22 will begin to charge to the negative potential at point A through the emitter-base path of transistor 1 and diode 23. The reset time of the multivibrator of FIG. 1 may be expressed mathematically as:

$$\text{Reset time}=C22\times\frac{R29\times(R27+R28)}{R27+R28+R29}\times N$$

Where C22 is the capacitance of capacitor 22 and the resistive term is the parallel resistance presented by resistors 28 and 29 and the portion of resistor 27, which is in the charging path, and N is a constant, which is usually selected to be 5, whereby the capacitor will become substantially completely charged in 5 time constants.

In a multivibrator circuit which has a fixed delay time or set time, the resistor 27 would not be variable. However, when resistor 27 is variable, it is possible to vary both the charging current through capacitor 22 and the voltage increment through which the capacitor 22 must charge. For example, if the wiper arm of variable resistor 27 were moved to its extreme left position, this would increase the resistance in the discharging path of capacitor 22 or would effectively decrease the discharging current from capacitor 22. Reference to the equation for the set time of the multivibrator reveals that an increase in resistance of resistor R27 will increase the set time of the multivibrator. Additionally, when the wiper arm of resistor 27 is moved to the left, the negative potential appearing at point A will increase. This may be seen by an analysis of the voltage divider presented by resistors 29 and 28, which will comprise the total resistance when the wiper arm of resistor 27 is at the extreme left. This increase in potential at point A will increase the voltage increment through which capacitor 22 must charge. Again referring to the equation of the set time of the multivibrator, it is noted that not only is the resistance term increased but the natural logarithm term is increased. Therefore, a single adjustment of variable resistor 27 will cause an increase in set time, but will also cause a de- through the capacitor 22 and the voltage increment through which the capacitor must charge.

The adjustment of variable resistor 27 will not only cause an increase in set time, but will also cause a decrease in reset time. However, it is noted that the change in set time will be greater than the change in reset time because of the variation of two parameters in the equation for set time as distinguished from the variation of one parameter in the equation for reset time. This variation of two parameters in the determination of set time permits an extremely wide range of control over this set time or delay time of the multivibrator.

For illustrative purposes, assume the following values for the components in the coupling circuit and for the voltage from source 6:

Resistor 26=1000 ohms
Variable resistor 27=10,000 ohms
Resistor 28=1000 ohms
Resistor 29=1000 ohms
Capacitor 22 has some constant value
Source 6=12 volts
The value of voltage at point B under normal operating conditions=−1 volt Thereafter, when the wiper arm of variable resistor 27 is in the extreme left-hand position, the set time will be approximately equal to $$11{,}000 \text{ ohms} \times C22 \times \ln \text{ of } 17/11,$$

which is equal to $4.73 \times 10^3$ ohms$\times C22$. On the other hand, when the wiper arm of resistor 27 is in its extreme right-hand position, the set time will be approximately equal to $$1{,}000 \text{ ohms} \times C22 \times \text{the } \ln \text{ of } 12/11,$$

which is equal to 86 ohms$\times C22$. Taking the ratio of the set time when the wiper arm of variable resistor 27 is in its two extreme positions, it is seen that there is a possible range of variation of 55 to 1. However, it is noted that the reset time will also vary, but its variation is significantly smaller than the variation in the set time. For example, assuming the above values, when the wiper arm of resistor 27 is in its extreme right-hand position the reset time will be approximately equal to $916 \times C22 \times N$, while in the extreme left-hand position, the reset time will be approximately equal to $$500 \times C22 \times N.$$

Thus, the ratio of reset time for the two extreme positions is equal to 1.83, which is substantially less than the range of variation for the set time for these conditions.

In some applications, it is desirable to have an output signal which has a constant pulse width but occurs at varibale times with respect to a reference signal. Such a signal is required in the computer art where a strobe pulse is utilized to read the information from a magnetic core memory in order to eliminate the noise which appears at the beginning of the read pulse and to permit the delay circuit to be utilized with any one of a plurality of different systems. The desirability of the availability of such a signal is not limited to the computer art but may be required in other fields. However, because of the particular application in the computer art, the derivation of such a signal will be discussed in connection with the computer art.

Figure 2:
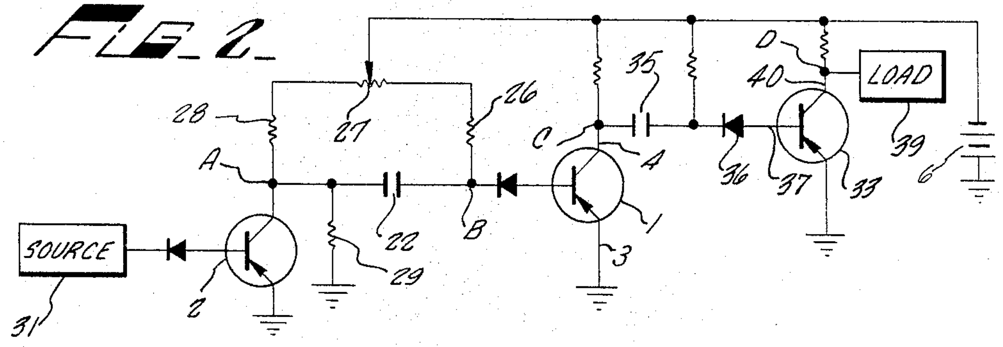
FIG. 2 is a schematic diagram of a multivibrator circuit in which the multivibrator circuit of FIG. 1 is employed.

Now referring to FIG. 2, there is shown a multivibrator circuit which includes the multivibrator circuit of FIG. 1. The multivibrator circuit of FIG. 2 additionally comprises a second multivibrator circuit that utilizes a portion of the first multivibrator circuit to effect its operation. The circuit components of FIG. 2, which are identical to the circuit components of FIG. 1, have the same reference numerals in FIG. 2.

The multivibrator circuit of FIG. 2 permits the reduction of active elements required by employing transistor switch 1 as an active element in the two multivibrator circuits. Transistor switch 1 is connected to a transistor switch 33 through an alternating-current coupling circuit which comprises a capacitor 35 in series with a diode 36. Capacitor 35 is connected to collector 4 of transistor 1 and diode 36 is connected to a base 37 of transistor switch 33. Thus, transistor switch 1 and transistor switch 33, in conjunction with the alternating-current coupling circuit, comprises a separate multivibrator circuit. This second multivibrator circuit has a fixed set time which determines the pulse width of the output signal, which is applied to load 39 from the collector 40 of transistor switch 33.

Figures 3, 4:
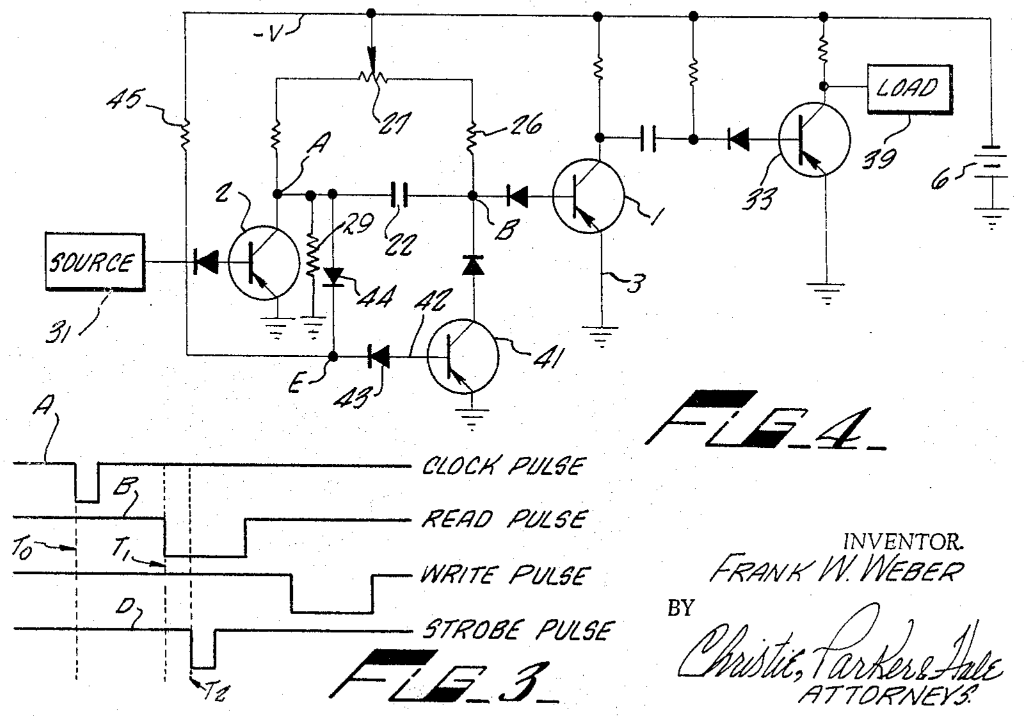
FIG. 3 is a pictorial diagram of waveforms of signals that exist in a computer system during the storing and recovering of information from a memory.
FIG. 4 is a schematic diagram of a modification of the multivibrator circuit of FIG. 2.

The multivibrator circuit of FIG. 2 has particular applicability in the computer art to produce a strobe signal. The waveforms and their relative time of occurrence which are present during the storage and recovery of information from a storage device in the computer art are shown in FIG. 3. In particular, a clock pulse, shown as waveform A in FIG. 3, initiates the action of a timing generator, which institutes the recovery of information from the storage device in a manner that is well-known in the computer art. At a predetermined time thereafter, a read pulse is generated as represented by waveform B. The read pulse occurs at some time $T_1$ after the occurrence of the clock pulse.

When magnetic cores are employed as the storage devices, it is desirable to have a strobe pulse somewhere within the time of the read pulse to effect the reading of the information from the magnetic core memory. Therefore, it is desirable to have the strobe pulse initiated by the initial occurrence of the read pulse shown as waveform B. Therefore, the strobe pulse of waveform D will occur at some time $T_2$ after the initiation of the read pulse at time $T_1$.

If the source 31 in FIG. 2 supplies the read pulse to the multivibrator of FIG. 2, the following sequence of operations will occur. The application of a negative pulse to transistor switch 2 will close transistor switch 2 to present the ground reference at point A. The appearance of ground reference at point A will cause a nearly instantaneous voltage change at point B so that transistor switch 1 will be opened. The opening of transistor switch 1 will cause a negative potential to appear at point C at the collector 4 of transistor switch 1. The appearance of the negative potential at point C will permit the capacitor 35 to charge and to reset the second multivibrator. During the charging of capacitor 35, transistor switch 33 will remain in its on condition to apply ground reference to the load 39 at point D. Thereafter, the voltage appearing at point B will decrease to some negative potential by the discharging of capacitor 22 through resistor 26 and variable resistor 27. When point B becomes sufficiently negative, transistor switch 1 will again turn on to mark the termination of the set time of the first multivibrator circuit. At the expiration of the set time of the first multivibrator circuit and the renewed conduction of transistor switch 1, the second multivibrator circuit will be switched to its second state wherein transistor switch 33 will be opened. The opening of the transistor switch 33 will cause the potential at point D to move away from the ground reference to some negative level so that an output pulse will appear in the load 39. Transistor switch 33 will remain in its nonconducting state during the set time of the second multivibrator circuit. Thus, the set time of the second multivibrator circuit determines the pulse width of the output signal while the set time of the first multivibrator circuit determines the delay time between the application of the input signal from source 31 and the appearance of an output signal in the load 39.

The delay circuit in the computer art may be employed in an apparatus that is used in conjunction with any one of a plurality of different computer systems. Thus, the delay circuit may be subjected to computer systems that have greatly different speeds of operation and frequency of signals. For example, one computer might employ clock pulses with a repetition rate of 5 microseconds while another computer might employ clock pulses with a repetition rate of one microsecond. Thus, to be able to employ the same delay circuit with the two different computer systems, it is required that the delay circuit have an extremely wide range of control. Thus, the circuit of FIG. 1 is particularly applicable as a delay circuit for employment with computer systems which have widely differing frequency of signals and the multivibrator circuit of FIG. 2 has particular application for providing a strobe pulse over a very wide range.

In the multivibrator circuit of FIG. 2, it was noted that the second multivibrator circuit went through its reset period while the transistor switch 1 was in its off condition. The transistor switch 1 was in its off condition during the set time of the first multivibrator circuit. However, for some applications it is desirable that the set time of the first multivibrator circuit be reduced to its minimum so that there is negligible delay between the appearance of the output pulse in the load 39 after the appearance of the input pulse from source 31. However, for extremely short delay periods, the transistor switch 1 is not off long enough to permit the resetting of the second multivibrator circuit. Thus, an additional transistor switch 41 is connected, as shown in FIG. 4, in the first multivibrator circuit to permit the resetting of the second multivibrator circuit at the termination of the input pulse from source 31.

Now referring to FIG. 4, when the input pulse from source 31 is initially applied, transistor 2 will close and will turn off transistor switch 1. After a short delay time or set time as determined by the characteristics of the alternating-current coupling circuit of capacitor 22, resistor 26 and variable resistor 27, the transistor switch 1 will again turn on. The reclosing of transistor switch 1 will cause the second multivibrator circuit to change states wherein transistor switch 33 will open to cause an output pulse to appear in the load 39. Thereafter, during the continuation of the application of an input pulse from source 31 to transistor switch 2, the transistor switch 2 will remain in its on condition. When the input pulse terminates, transistor switch 2 will open and will remove ground reference from point A. The removal of ground reference from point A will cause the activation of transistor switch 41.

The base 42 of transistor switch 41 is connected to point A through a diode 43 and a diode 44. At the junction point of diodes 43 and 44, a resistor 45 is connected to the negative terminal of source 6. Thus, diode 44 will be forward biased when the ground reference appears at point A through the closing of transistor switch 2. Thereafter, this ground reference will essentially appear at the junction point E between diodes 44 and 43 through the low impedance of forward biased diode 44. The appearance of ground reference at point E will cause transistor switch 41 to open.

Thereafter, the opening of transistor switch 2, by the removal of the input signal, will cause the ground reference to be removed from point A and a negative potential to be applied to this point. Thus, a negative potential will appear at point E to turn transistor switch 41 on. The closing of transistor switch 41 will effectively apply ground reference to point B. The appearance of ground reference at point B will cause transistor switch 1 to open. The opening of transistor switch 1 will permit the second multivibrator circuit to reset in preparation for the application of the next input signal from source 3. Thus, no matter how short the set time of the first multivibrator circuit, the second multivibrator circuit will be permitted to reset during the period of time between input pulses.

The invention is particularly applicable when it is desired to include the reset time in the output signal. The basic ideas and advantages accrued therefrom by including the reset time in the output pulse are disclosed and claimed in my copending patent application Serial No. 134,220, filed August 28, 1961, now Patent No. 3,132,-261, issued May 5, 1964, and assigned to the same assignee as this application. Primarily, the advantage is that reset time is no longer a problem in the design of the multivibrator circuit. To include the reset time in the output pulse of the multivibrator, the circuit of FIG. 1 is modified as shown in FIG. 5.

In place of the resistor which was connected to point A at the collector 24 of transistor 2, an additional transistor 51 is connected thereto. Collector 52 of transistor 51 is connected directly to point A and the emitter 53 is connected to base 55 of another transistor 56. Transistor 56 isolates the load circuit from the multivibrator's coupling circuit. Collector 57 of transistor 56 is connected to the negative terminal of source 6 through a resistor 58. A load 60 is connected to point D at the junction of resistor 58 and collector 57.

The coupling circuit between the two transistor switches, i.e., transistor 1 and its associated circuitry and transistor 2 and its associated circuitry, is basically the same as the coupling circuit in FIG. 1. However, the coupling circuit in FIG. 5, which basically comprises capacitor 22, resistor 26, resistor 28 and variable resistor 27, is connected in a slightly different manner in order to permit the inclusion of the reset time in the output pulse of the multivibrator. Transistor 51 is biased through the voltage divider comprising resistor 63 in series with resistor 28 and variable resistor 27. This voltage divide circuit is connected directly across the source 6. When transistor 51 is conducting, the potential at point A, i.e., at the collector 52, will be substantially equal to the potential on the base 61. Thus, by varying the resistance presented by variable resistor 27, the potential at the base 61 may be varied. By varying the potential on the base 61 and thereby the potential at point A, the voltage increment through which capacitor 22 has to change is varied. Additionally, when the resistance presented by variable resistor 27 is varied, the charging current of the capacitor 22 is also varied. Thus, it is seen that the circuit of FIG. 5 operates in the same manner as the circuit of FIG. 1.

Figure 5:
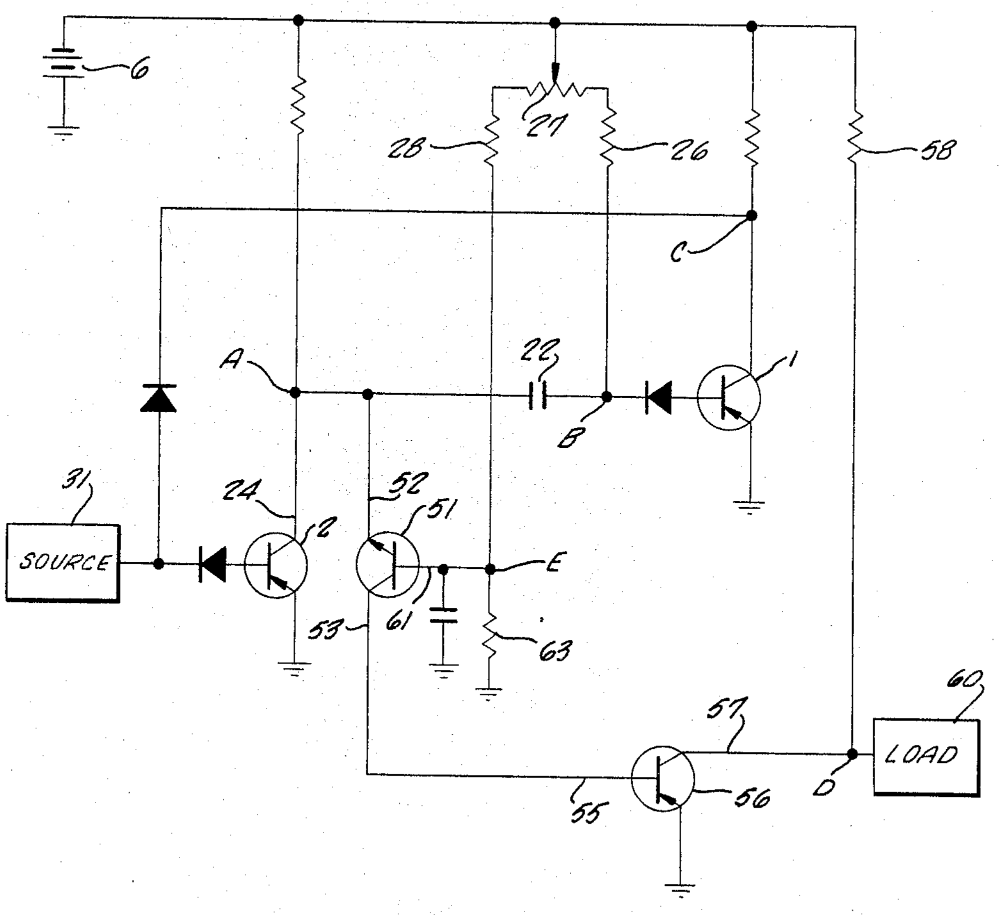
FIG. 5 is a schematic diagram of an alternative embodiment of a multivibrator circuit, in accordance with the present invention.

The normal operation of the multivibrator shown in FIG. 5 includes a stable state wherein transistors 1, 51 and 56 are conducting and transistor 2 is nonconducting. When an input pulse is applied to transistor 2 from source 31, transistor 2 will turn on and essentially ground reference will appear at point A. Thereafter, transistor 1 will turn off and the delay period or quasi-stable state of the multivibrator will be entered into. The appearance of ground reference at point A will make the base 61 of transistor 51 more negative than the emitter 52 so that transistor 51 will turn off. Transistor 56 will also turn off so that a negative potential will appear at point D and will be applied to the load 60. Thereafter, the multivibrator will go through its set or quasi-stable state and transistor 1 will again turn on with transistor 2 subsequently turning off. When the transistor 1 turns on, the multivibrator will begin its reset period in which capacitor 22 will begin to recharge. The voltage at point A will become increasingly negative until the expiration of the reset time at which time the base 61 will be more positive than the emitter 52 so that transistor 51 will again turn on. The turning on of transistor 51 will cause transistor 56 to turn on with the appearance of ground reference at point D and the termination of the output pulse. Thus, it is seen that the output pulse includes both the set and the reset times of the multivibrator.

What is claimed is:

1. In combination, a pair of switches each having an input circuit and an output circuit; means for normally biasing a first of said switches in a selected conduction state of two possible conduction states of substantially full conduction and no conduction; means for normally biasing the second of said switches in a selected conduction state of two possible conduction states of substantially full conduction and no conduction; coupling means for making the second switch initially responsive to the conduction state of the first switch to change the conduction state of said second switch; said coupling means comprising a first resistor connected between the output circuit of said first switch and ground reference, a voltage source, a variable resistor having a first fixed terminal, a second fixed terminal, and a variable terminal, means for coupling the variable terminal to said source, a capacitor connected between the output circuit of said first switch and the input circuit of said second switch, a second resistor connected between the output circuit of said first switch and the first fixed terminal of said variable resistor, and a third resistor connected between the input circuit of said second switch and the second fixed terminal of said variable resistor, and means for applying voltage impulses to said first switch to reverse the conduction state of said first switch.

2. In combination a source of trigger pulses; a first multivibrator circuit having a delay time and a stable state including a reset time; a second multivibrator circuit having a delay time and a stable state including a reset time, said first and second multivibrator circuits having a common switch; said common switch having an input terminal and an output terminal, an output circuit; means for connecting said source to said first multivibrator circuit; means for connecting said output circuit to said second multivibrator circuit, said first multivibrator circuit comprising a first switch having an output terminal and said common switch and an alternating-current coupling circuit for making said common switch initially responsive to the conduction state of said first switch, said coupling circuit comprising a timing capacitor connected between the output terminal of said first switch and the input terminal of said common switch, a first resistor connected between the output terminal of said first switch and ground reference, a voltage source, a variable resistor having a first fixed terminal, a second fixed terminal and a variable terminal, means for coupling the variable terminal to said voltage source, a second resistor connected between the output terminal of said first switch and the first fixed terminal of said variable resistor, and a third resistor connected between the input terminal of said common switch and second fixed terminal of said variable resistor, said second multivibrator circuit including a second switch interconnected to and responsive to the conduction state of said common switch through an alternating-current coupling circuit including a timing capacitor; and means for placing said second switch in its off conduction state at the termination of an input pulse from said source to permit said second multivibrator circuit to reset.

3. In combination four switches each having an input circuit and an output circuit and two states of conduction, said conduction states being an on state and an off state, means for normally biasing said first and second switches in the off state during the absence of an input pulse, means for normally biasing said third and fourth switches in the on state during the absence of an input pulse, means for applying an input signal from said source to said first switch, said first switch changing states upon the application of said input pulse and said fourth switch changing states upon the changing of state of said first switch, an alternating-current coupling circuit interconnecting said first and second switches for forming a first multivibrator circuit having a delay period and a reset period, said coupling circuit comprising a timing capacitor, a resistive discharge path for said capacitor, and means for selectively simultaneously varying the resistance in said discharge path of the capacitor and the voltage increment through which the capacitor must operate, the delay period of said first multivibrator circuit being initiated upon the application of said input pulse to said first switch, an alternating-current coupling circuit interconnecting said second and third switches for controlling the conduction state of said third switch in response to the conduction state of said second switch to effect a second multivibrator circuit, said second switch changing conduction states at the end of the delay period of said first multivibrator circuit to cause said third switch to change conduction states to produce an output signal in the output circuit of said third switch, means for connecting said fourth switch between the output circuit of said first switch and the input circuit of said second switch for turning said second switch off at the expiration of an input pulse to permit said second multivibrator circuit to reset.

4. In combination, a first switch having an input circuit and an output circuit and two conduction states, a second switch having an input circuit and an output circuit and two conduction states, a third switch having an input circuit and an output circuit and two conduction states, said conduction states of each switch being an on state and an off state, a first alternating-current coupling means for initially changing the conduction state of said second switch in response to the conduction state of said first switch thereby forming a first multivibrator circuit including the first and second switches and the first coupling means, said first coupling means including a variable timing network for determining the duration of the off time of said second switch after said first switch changes from its off conduction state to its on conduction state which causes said second switch to change to its off conduction state, said timing network including a timing capacitor and means for simultaneously controlling the resistance in the discharge path of said capacitor and the voltage increment through which the voltage across said capacitor can change, and a second alternating-current coupling means for controlling the conduction state for said third switch in response to the conduction state of said second switch to form a second multivibrator circuit including said second and third switches and said second coupling means.

5. In combination four switches each having a control terminal, an output terminal, and a common terminal; means for normally biasing a first of said switches in its off condition; means for normally biasing a second of said switches in its on condition; means for normally biasing a third of said switches in its on condition; means for normally biasing in its on condition the fourth of said switches through said third switch; an output circuit connected to the output terminal of said fourth switch; coupling means for making said second switch initially responsive to the conduction state of said first switch; said coupling means comprising a capacitor connected between the output terminal of said first switch and the control terminal of said second switch, a voltage source, a variable resistor having a first fixed terminal, a second fixed terminal, and a variable terminal, means for coupling the variable terminal to said source, a first resistor connected between the input terminal of said second switch and the first fixed terminal of said variable resistor, and a voltage divider network including two fixed resistors in series connected between the second fixed terminal of said variable resistor and ground reference; means for connecting the control terminal of said third switch to the junction point between the two resistors of said voltage divider network; and means for connecting the common terminal of said third switch to the output terminal of said first switch.

6. A multivibrator circuit comprising a first electronic switch having an output terminal, a second electronic switch having a control terminal, a third electronic switch intermediate the first and second switches and having an output terminal and a control terminal, means for coupling voltage variations from the output of the first switch to the control terminal of the third switch to form a first multivibrator circuit, the coupling means including a first resistor connected between the output terminal of said first switch and ground reference, a voltage source, a variable resistor having a first fixed terminal, a second fixed terminal and a variable terminal, means for coupling the variable terminal to said source, a capacitor connected between the output terminal of said first switch and the input terminal of said third switch, a second resistor connected between the output terminal of said first switch and the first fixed terminal of said variable resistor, and a third resistor connected between the input terminal of said third switch and the second fixed terminal of said variable resistor, and an alternating-current coupling circuit including a timing capacitor connected between the output terminal of the third switch and the control terminal of the second switch to form a second multivibrator circuit including the second and third switches and the alternating-current coupling circuit.

7. In combination a source of trigger pulses, a first electrically sensitive device having an active state and an inactive state, a second electrically sensitive device having an active state and an inactive state, a third electrically sensitive device having an active state and an inactive state, first means for coupling the first and the second devices to form a first multivibrator having a normal state and a timing state, second means for coupling the second and the third devices to form a second multivibrator having a normal state and a timing state, and third means for coupling trigger pulses from the source to the first device, the first coupling means comprising a fourth electrically sensitive device for switching the second device to its inactive state at the termination of each input pulse from said source, means for controlling the duration of the timing state of the first multivibrator and means for changing the operation of the second device to its active state at the termination of the timing state of the first multivibrator, the controlling means comprising a timing capacitor and means for selectively varying simultaneously the discharge current passing through the capacitor and the voltage increment through which the capacitor operates.

References Cited by the Examiner

UNITED STATES PATENTS

| | | | |
|---|---|---|---|
| 2,569,232 | 9/1951 | DeLiban | 328—226 X |
| 2,987,632 | 6/1961 | Milford | 307—88.5 |
| 3,065,309 | 11/1962 | Gifford | 307—88.5 X |
| 3,068,367 | 12/1962 | Brown et al. | 307—88.5 |
| 3,068,406 | 12/1962 | Dellinger | 307—88.5 X |
| 3,153,153 | 10/1964 | Ladd | 307—88.5 |
| 3,214,602 | 10/1965 | Heyning et al. | 307—88.5 |

FOREIGN PATENTS

| | | |
|---|---|---|
| 899,502 | 6/1962 | Great Britain. |

ARTHUR GAUSS, *Primary Examiner.*

M. LEE, J. JORDAN, *Assistant Examiners.*